(12) United States Patent
Tinnemans et al.

(10) Patent No.: US 7,126,672 B2
(45) Date of Patent: Oct. 24, 2006

(54) LITHOGRAPHIC APPARATUS AND DEVICE MANUFACTURING METHOD

(75) Inventors: Patricius Aloysius Jacobus Tinnemans, Hapert (NL); Johannes Jacobus Matheus Baselmans, Oirschot (NL); Laurentius Catrinus Jorritsma, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 44 days.

(21) Appl. No.: 11/020,642

(22) Filed: Dec. 27, 2004

(65) Prior Publication Data

US 2006/0139600 A1 Jun. 29, 2006

(51) Int. Cl.
*G03B 27/54* (2006.01)
*G03B 27/42* (2006.01)

(52) U.S. Cl. .......................................... 355/67; 355/53
(58) Field of Classification Search ................ 355/53, 355/67–71; 430/5, 20, 30; 359/224
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |

(Continued)

FOREIGN PATENT DOCUMENTS

WO      WO 98/33096      7/1998

(Continued)

OTHER PUBLICATIONS

Castleman, Kenneth R., *Digital Image Processing*, Prentice Hall, Inc., Upper Saddle River, New Jersey, pp. 641-642 (1996).

(Continued)

*Primary Examiner*—Henry Hung Nguyen
(74) *Attorney, Agent, or Firm*—Sterne, Kessler, Goldstein & Fox P.L.L.C.

(57) ABSTRACT

A lithography apparatus including a projection system configured to project a beam of radiation onto a substrate as an array of sub-beams of radiation and an array of individually controllable elements configured to modulate the sub-beams of radiation. The apparatus also includes a data-path including at least one data manipulation device arranged to at least partly convert data defining a requested pattern to a control signal suitable for controlling the array of individually controllable elements to form substantially the requested pattern on the substrate. The data manipulation device is arranged to carry out the conversion by applying a pseudo-inverted form of a point-spread function matrix to a column vector representing the requested pattern. The point-spread function matrix includes information about the shape and relative position of the point-spread function of each spot to be exposed on the substrate by one of the sub-beams of radiation at a given time.

10 Claims, 4 Drawing Sheets

U.S. PATENT DOCUMENTS

| | | | |
|---|---|---|---|
| 6,811,953 B1 | 11/2004 | Hatada et al. | |
| 6,841,787 B1 * | 1/2005 | Almogy | 250/492.24 |
| 6,897,941 B1 * | 5/2005 | Almogy | 355/67 |
| 7,050,155 B1 | 5/2006 | Case et al. | |
| 2003/0128347 A1 | 7/2003 | Case et al. | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/38597 | 9/1998 |

OTHER PUBLICATIONS

European Search Report, dated Apr. 19, 2006, for European Patent Application No. 05257741.8, 7 pages.

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of a die, one die, or several dies) on a substrate (e.g., a silicon wafer or glass plate) that has a layer of radiation-sensitive material (e.g., resist). Instead of a mask, the patterning means can comprise an array of individually controllable elements that generate the circuit pattern. Lithographic systems utilizing such arrays are generally described as maskless systems.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or anti-parallel to this direction.

The user of such apparatus defines a requested pattern to be formed on the substrate that is characterized by a particular dose-map of radiation. In maskless systems, data representing a requested dose-map is processed with reference to calibration measurements in order to obtain an actuating signal to send to the array of individually controllable elements. Areas of high pattern density in the dose-map require exposed spots on the substrate to overlap with each other. It has been found that, under certain circumstances, these regions of overlapping patterns can cause errors in the processing of the requested dose-map.

The process of joining one region of pattern to another region of pattern is known as seaming. Seaming can be carried out for patterns originating from a single optical column (e.g., receiving input from a single array of individually controllable elements), or between patterns from different optical columns (e.g., each receiving input from a separate array of individually controllable elements). Seaming in these situations can be achieved by arranging for the dose-maps of each of the overlapping patterns to reduce gradually over an overlap region. However, this approach can be difficult to regulate, particularly where the overlap region is narrow.

Therefore, what is needed is a lithography apparatus and device manufacturing method that improves the handling of regions prone to excess exposed spot overlap.

SUMMARY OF THE INVENTION

According to an embodiment, there is provided a lithography apparatus that includes a projection system, an array of individually controllable elements, and a data path. The projection system is configured to project a beam of radiation onto a substrate as an array of sub-beams of radiation. The array of individually controllable elements is configured to modulate the sub-beams of radiation. The data path includes at least one data manipulation device arranged to at least partly convert data defining a requested pattern to a control signal suitable for controlling the array of individually controllable elements to form substantially the requested pattern on the substrate. The data manipulation device is arranged to carry out the conversion by applying a pseudo-inverted form of a point-spread function matrix to a column vector representing the requested pattern. The point-spread function matrix includes information about the shape and relative position of the point-spread function of each spot to be exposed on the substrate by one of the sub-beams of radiation at a given time.

According to another embodiment, there is provided a device manufacturing method, including the steps of projecting a beam of radiation onto a substrate as an array of sub-beams of radiation, modulating the sub-beams of radiation with an array of individually controllable elements, and at least partially converting data defining a requested pattern to a control signal suitable for controlling the array of individually controllable elements to form substantially the requested pattern on the substrate. The conversion of data is done at a data manipulation device in a data path. The data conversion is carried out by applying a pseudo-inverted form of a point-spread function matrix to a column vector representing the requested pattern. The point-spread function matrix includes information about the shape and relative position of the point-spread function of each spot to be exposed on the substrate by one of the sub-beams of radiation at a given time.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form apart of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE INVENTION

Overview and Terminology

Figure 1:
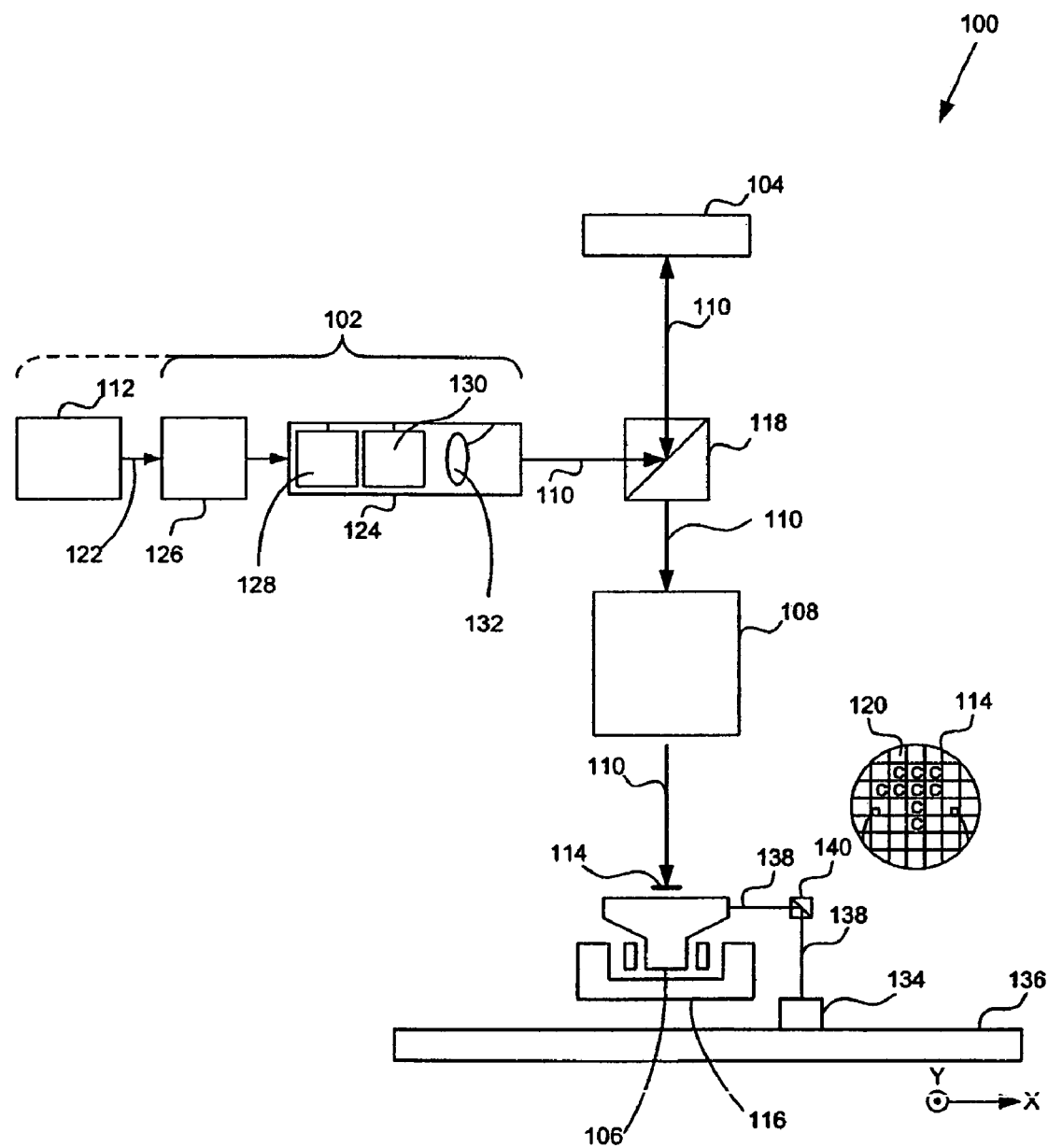
FIG. 1 depicts a lithographic apparatus according to an embodiment of the invention.

Although specific reference can be made in this text to the use of lithographic apparatus in the manufacture of integrated circuits (ICs), it should be understood that the lithographic apparatus described herein can have other applications, such as, for example, the manufacture of DNA chips, micro-electromechanical systems (MEMS), micro-optical-electromechanical systems (MOEMS), integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light.

Using an appropriate spatial filter, the filter can filter out the diffracted light, leaving the undiffracted light to reach the substrate. In this manner, the beam becomes patterned according to the addressing pattern of the matrix addressable surface. It will be appreciated that, as an alternative, the undiffracted light can be filtered out of the reflected beam, leaving the diffracted light to reach the substrate. An array of diffractive optical micro-electricalmechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors that can each be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors. In this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, that are incorporated herein by reference in their entireties. A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 408, 355, 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more object (or substrate) tables (and/or two or more mask tables). In such "multiple stage" machines the additional tables can be used in parallel, or preparatory steps can be carried out on one or more tables while one or more other tables are being used for exposure.

The lithographic apparatus can be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the programmable mask (i.e., the array of controllable elements) and the first element of the projection system and/or between the first element of the projection system and the substrate. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114, as is discussed in more detail below.

Source 112 (e.g., a frequency tripled Nd:YAG laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 can also be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, object table 106 can be fixed, with substrate 114 being moveable over object table 106. Where this is done, object table 106 is provided with a multitude of openings on a flat uppermost surface, gas being fed through the openings to provide a gas cushion which is capable of supporting substrate 114. This is conventionally referred to as an air bearing arrangement. Substrate 114 is moved over object table 106 using one or more actuators (not shown), which are capable of accurately positioning substrate 114 with respect to the path of beam 110. Alternatively, substrate 114 can be moved over object table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus can be used in five modes:

1. Step mode: the entire pattern on the array of individually controllable elements 104 is projected in one go (i.e., a single "flash") onto a target portion 120. Object table 106 is then moved in the X and/or Y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is moveable in a given direction (the "scan direction," e.g., the Y direction) with a speed v, so that patterned beam 110 is caused to scan over the array of individually controllable elements 104. Concurrently, object table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. One substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Imaging Systems

Figure 2:
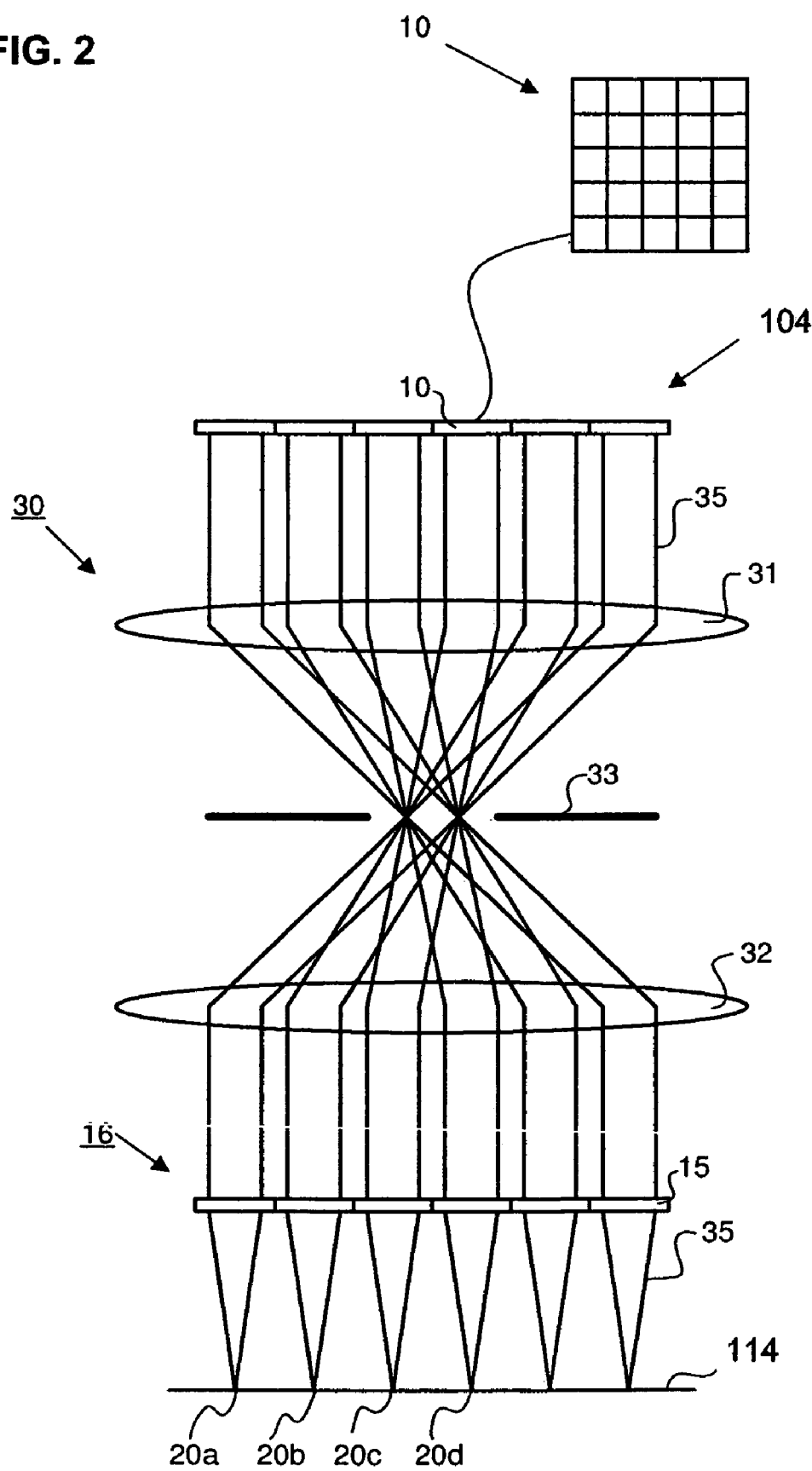
FIG. 2 depicts a side view of a portion of an array of individually controllable elements, micro-lens array and spot grid formed thereby according to an embodiment of the invention.

FIG. 2 shows an arrangement of an array of individually controllable elements 104, according to embodiments of the present invention. According to the arrangement shown, groups of elements in the array 104 are imaged together as a "super-pixel" 10. However, it remains within the scope of the invention to image single pixels separately rather than use super-pixels. Each (super-) pixel 10 produces sub-beams 35 of radiation, which pass through an optical system 30 shown for simplicity to consist of two simple lenses 31 and 32 with an aperture stop 33 located between the two. The aperture stop 33 in this position is necessary to reduce the level of unwanted radiation reaching the substrate 114. After passing through the optical system 30, the radiation from each (super-) pixel 10 impinges on a micro-lens 15 in a micro-lens array 16, which focuses each sub-beam 35 onto a localized region or "spot" (20a–20d) at the surface of the substrate 114. A typical configuration for a super-pixel 10 is shown in the figure and comprises a square grid of 5×5 elements. The intensity of each of the spots in the spot grid 20 thus formed is controlled for each flash of incident laser light by controlling the tilt of elements in the array of individually controllable elements 104 that make up each (super-) pixel 10.

The separation of spots in the spot grid 20 can be of the order of 300 microns, which is much larger than a typical critical dimension (CD) (a measure of the smallest feature that can be imaged), which is typically on the order of 3 microns. A denser pattern of localized exposures, the "exposed spot grid," is achieved by using a periodically flashing laser source and moving the substrate along a scan direction Y with one of the axes 22 of the rectangular spot grid offset by a small angle relative to the scan axis Y (see FIG. 3). According to the embodiment discussed, the laser is configured to flash at 50 kHz and the substrate is moved at a speed of 62.5 mm per second. The result is that localized exposures are separated in the Y direction by 1.25 microns. The separation in an X direction perpendicular to the scan direction Y depends on the angle that the spot grid makes relative to the scan axis Y. (These values, as well as those provided in other embodiments, are provided by way of example, not limitation.)

Figure 3:
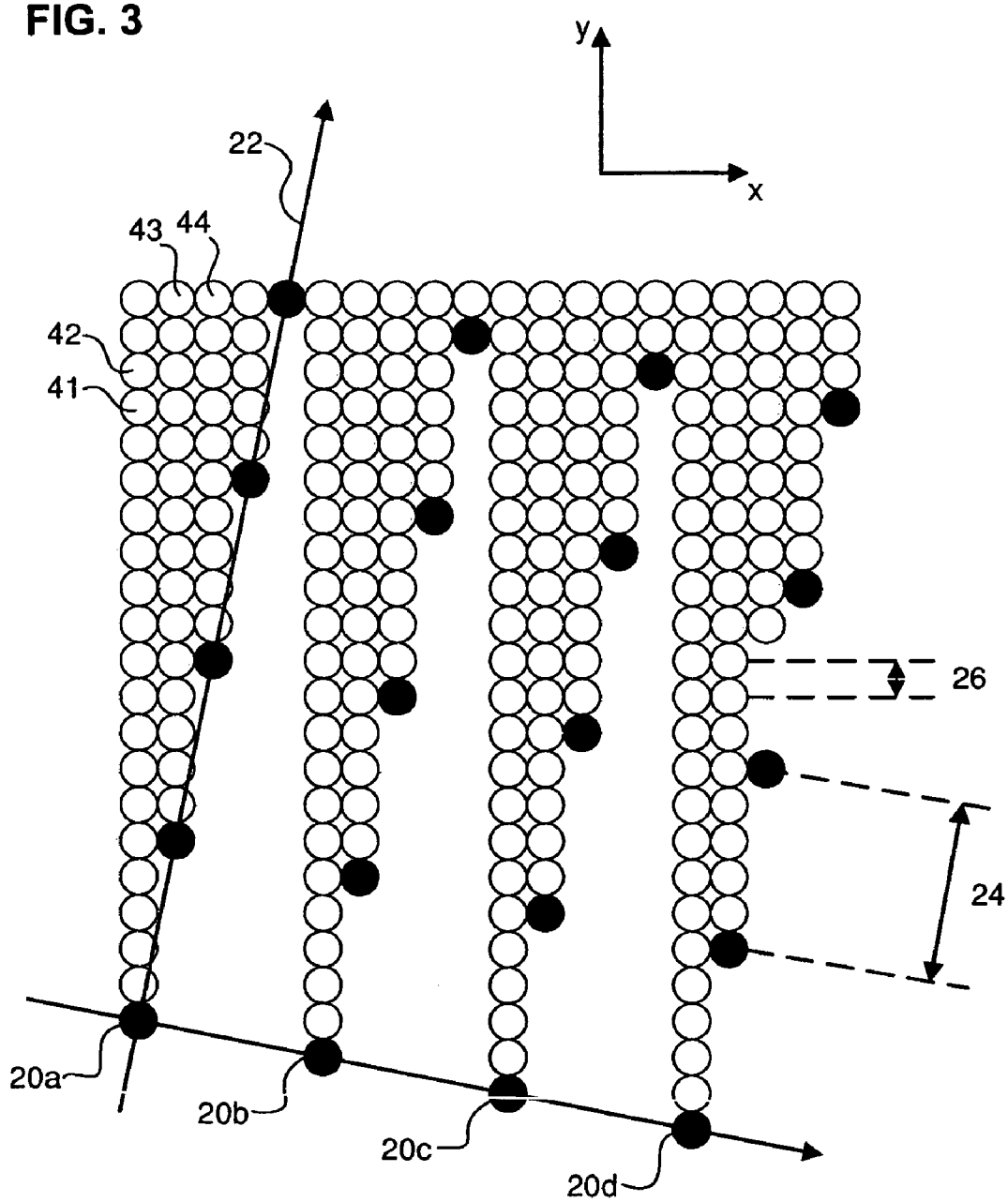
FIG. 3 depicts the formation of an exposed spot grid.

The arrangement is shown schematically in FIG. 3, which represents a snapshot in time for a spot-grid configured to produce a uniform dose-map or pattern on the substrate 114. The filled circles represent the positions of each of the spots in the spot grid at a given time while open circles represent spots that were written at earlier times (i.e., they represent "exposed spots," also referred to as "localized exposures," in the exposed spot grid). Although shown without overlap in the interest of clarity, the intensity profile of each spot would normally be arranged to overlap with its neighbors. The substrate 114 is moving upwards in the figure, along the Y-axis, relative to the projection system 108 and spot grid, which are held fixed relative to the page. The angle of axis 22 to the Y-axis has been exaggerated for clarity, a much smaller angle can be used for the working apparatus (the ratios of the spot separation 24 to the spot separation 26 would also be correspondingly much higher than that shown in the example). Spots 20a to 20d correspond to the focused beams numbered in the same way in FIG. 2, but viewed along axis 22.

According to this arrangement, spots which are neighbors in the Y direction, such as spots 41 and 42, are imaged at relatively closely spaced times, separated by the period of the laser beam (0.02 ms). Spots that are neighbors in the X direction, such as spots 43 and 44, on the other hand, are imaged at quite different times. For example, in the case where the separation between spots in the spot grid is 320 microns, 256 flashes will be required with an exposed spot distance of 1.25 micrometers in order for the next neighbor in the X direction to be exposed.

Figure 4:
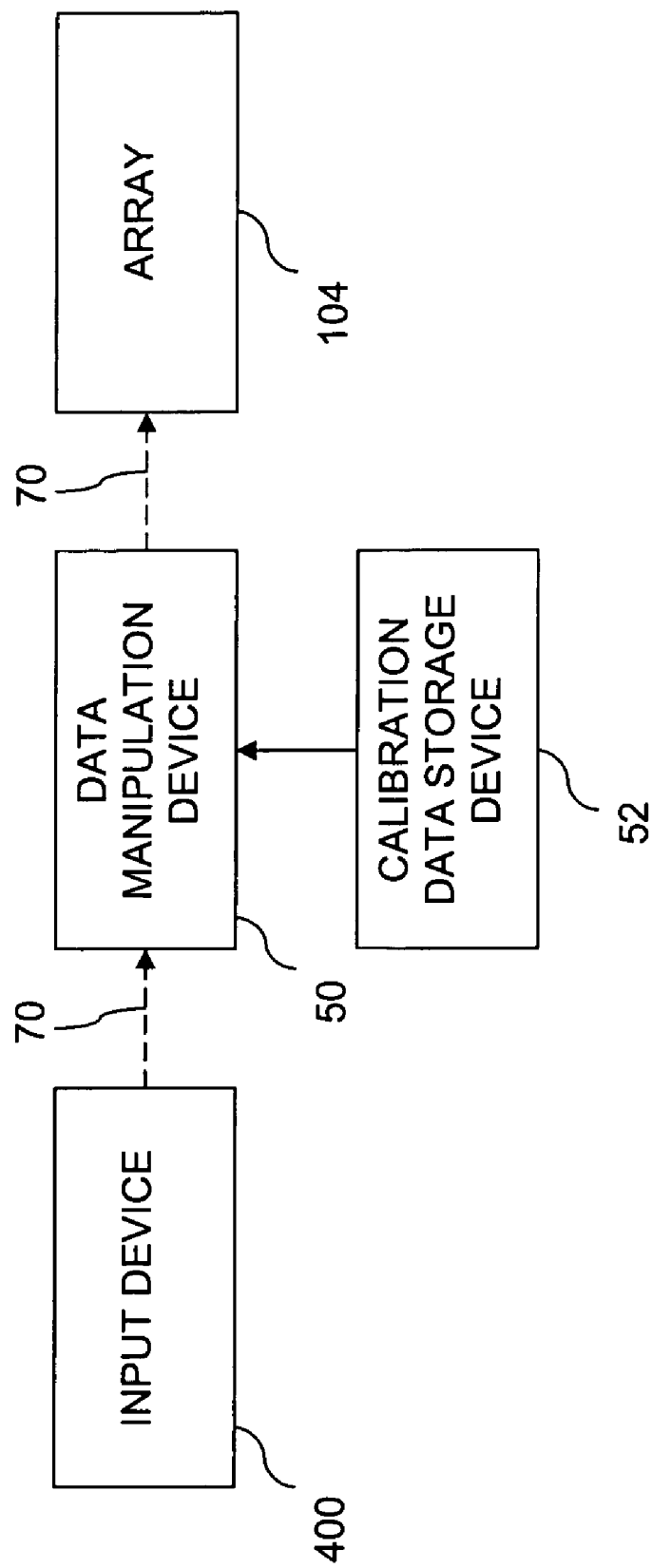
FIG. 4 depicts a data manipulation device in the data path.

FIG. 4 provides a schematic illustration of the portion of the data path architecture to which the present invention relates. As described above, a control signal is transmitted to the array 104 along a data path 70. Elements within the data path are provided to convert a dose map or pattern of radiation requested by a user of the lithography apparatus via input device 400 (usually provided in a descriptive form, for example, vector based) to a signal that will cause the array 104 to produce the requested dose map on the substrate 114. These elements include a data manipulation device 50, depicted in FIG. 4, which is configured to analyze an incoming data stream comprising a (usually partly processed) version of the requested pattern and output the necessary signal to the array 104 or to devices that will process the data stream further before passing it on to the array 104. Part of the functionality of the data manipulation device 50 includes deciding for each pixel of the requested dose-map (which can, for example, be defined on a grid of points relative to the substrate 114) which super-pixels of the array 104 need to be actuated and to what extent. The data manipulation device 50 effectively calculates an optimal sub-beam intensity for each of the localized exposures to be made on the substrate 114. The requested dose-map is then built up over time from the array of localized exposures produced as the spot grid moves over the surface of the substrate 114. The process of providing the array 104 with the optimal sub-beam intensities is complicated by the fact that for each flash of the laser, each super-pixel causes (non-uniform) illumination of an area on the substrate larger than one of the substrate grid elements so that for each localized exposure, the desired sub-beam intensity will depend on what dose map has been requested in a region surrounding the localized exposure.

The requested dose-map can be expressed as a column vector comprising elements that represent the required dose at each one of the grid positions on the substrate 114. The grid positions in the requested dose-map can be specified relative to their coordinates in the metrology frame coordinate system: XMF, YMF. As mentioned above, this requested dose-map is to be built up from a collection of exposed spots originating from the super-pixels in the array 104. Each of these spots will have a certain point-spread function that describes the cross-sectional spatial dependence of their intensity. In addition, there will be variations in the positions of each of the spots from their expected positions in the spot grid due to irregularities in the micro-lens array used to focus the spots. Both the spot positions and the spot point-spread function shapes can be input to the data manipulation device 50 via a calibration data storage device 52.

The process of forming a pattern in this way is referred to as pixel grid imaging. The process involves building up the requested dose-map pattern via contributions from spots at all possible grid positions on the substrate 114. Mathematically, the requested dose-map is set to be equal to a sum over all possible exposed spots of a required intensity at each exposed spot multiplied by a point-spread function for each exposed spot. This can be written as the following equation:

$$D(x_{MF}, y_{MF}) = \sum_{n}^{all\,exposed\,spots} I_n \cdot PSF_n((x_{MF} - x_n), (y_{MF} - y_n)),$$

where $I_n$ represents the required individual exposed spot intensity for exposed spot n, $PSF_n((x_{MF}-x_n), (y_{MF}-y_n))$ represents the point-spread function (the dose contribution at location $x_{MF}$, $y_{MF}$ of exposed spot n), $x_n$ and $y_n$ indicate the position of an individual exposed spot and $D(x_{MF}, y_{MF})$ represents the requested dose-map.

The problem to be solved by the data manipulation device 50 is: given the requested dose-map and the point-spread function information (that is provided as calibration data), what are the individual exposed spot intensities that need to be provided to image the requested dose-map as accurately as possible?

The above equation can be re-written in vector form as follows:

$$[D]=[K]\cdot[I],$$

where the column vector [D] represents the discrete (i.e., specified on specific substrate grid positions) requested dose-map, the column vector [I] represents the individual exposed spot intensity and the matrix [K] represents the discrete point-spread function.

Matrix [K] contains information on each individual exposed spot point-spread function (both position and shape). Therefore, according to the present embodiment, the following information is necessary in order to generate the matrix [K]:

1) scan speed/laser strobe frequency;
2) micro-lens array spot positions;
3) micro-lens array point-spread function shape; and
4) rotational position of the micro-lens array with respect to the substrate scan direction (stage Y-axis).

In order to solve the above problem, the data manipulation device 50 is arranged to determine the individual exposed spot intensities such that $[D]-[K]\cdot[I]$ is minimized. In order to assess this minimum, a normalization is required. Due to the fact that this approach is applied in a pipeline environment (e.g., not all of the exposed spots on the substrate are written at the same time) and the fact that one MLA spot is used to print many exposed spots (using many different laser pulses), it is necessary to use the universal normalization, in which specific knowledge of the requested pattern cannot be used. Use of such specific knowledge could in principle be incorporated but would lead to a large increase in the cost of the apparatus.

A least squares approach is therefore suitable and the problem to be solved by the data manipulation device 50 can therefore be expressed as:

$$\min_{I_n}\|[D]-[K]\cdot[I]\|_2.$$

Several approaches have been used for solving least squares problems of this general type. These can be classified as follows:

1) Geometric, using Jacobians (an iterative approach), etc.;
2) Algebraic, using an iterative approach (e.g., Gauss-Seidel); and
3) Algebraic, using a direct approach (e.g., Gauss-Jordan, using a matrix inverse).

The method of the present embodiment falls into the third of these classes. It has the advantage of being fast (once the inverse matrix has been determined) relative to options that require iteration and allows the least squares fit to be carried out effectively in real time. In addition, it displays deterministic behavior, which allows predictable convergence and speed under a greater variety of conditions. With iterative schemes, in contrast, it is often not possible to predict with great accuracy how long it will take for the solution to converge within acceptable error limits. Furthermore, round off problems due to limited word size in the data path hardware are minimal for this approach due to the avoidance of re-use of intermediary results. Finally, there are implementation advantages because the difficult preparation calculations (e.g., matrix inversion, etc.) can be performed offline in a large word size domain (e.g., a floating point domain), rather than having to carry out extra calculations during the actual imaging process (when the data path is already processing a large volume of data).

One problem faced by the present embodiment is that the matrix [K] is not square. It has a size determined by the number of exposed spots n and the number of discrete grid points at which the requested dose-map is specified (the length of column vector [D]). Therefore, it is not possible to calculate the inverse of the matrix [K] using standard mathematical techniques. However, it is possible to proceed by calculating a "pseudo-inverse" (see for example "Linear Algebra and its Applications," Third Edition, Gilbert Strang, pages 449 and 450, which are incorporated herein by reference in their entirety). In the description that follows, the pseudo-inverse is denoted as [K]+. The Moore-Penrose definition of the pseudo-inverse can be used, for example, but other analogous definitions are also suitable. More details are given below.

The Moore-Penrose matrix inverse is a special case of a general type of pseudo-inverse known as a "matrix 1-inverse." It is sometimes referred to as the "generalized inverse," or simply the "pseudo-inverse." The Moore-Penrose inverse $[K]^+$ of a matrix [K] satisfies the following relations:

$$[K][K]^+[K]=[K],$$

$$[K]^+[K][K]^+=[K]^+,$$

$$([K][K]^+)^T=[K][K]^+, \text{ and}$$

$$([K]^+[K])^T=[K]^+[K].$$

The shortest least squares solution to the problem $[D]=[K]\cdot[I]$ (that was expressed as $\min_{I_n}\|[D]-[K]\cdot[I]\|_2$, see above) can be written in the following form: $[I]=[K]^+\cdot[D]$.

If the inverse of $([K]^T[K])$ exists, then the pseudo-inverse $[K]^+$ can be expressed as:

$$[K]^+ = ([K]^T[K])^{-1}[K]^T,$$

where $[K]^T$ is the matrix transpose. This can be seen by pre-multiplying both sides of the equation $[D]=[K]\cdot[I]$ by $[K]^T$ to create a square matrix $([K]^T[K])$, which can be inverted normally, giving:

$$[I] = ([K]^T[K])^{-1}[K]^T\cdot[D] = [K]^+\cdot[D].$$

The laser mode used according to an embodiment of the invention is TEM$_{00}$, which gives a Gaussian-shaped intensity profile that is maintained through the optical system all the way to the substrate 114. However, other laser modes and intensity profiles can also be used. A pattern of continuous intensity is achieved by arranging for neighboring exposed spots to overlap slightly. An example closest exposed spot separation according to an embodiment of the invention is, as mentioned above, 1.25 microns with a standard deviation of the Gaussian associated with each of 0.75 microns. Within a row (defined along an axis of the spot grid most nearly parallel to the substrate scanning direction Y) of a spot grid associated with a given optical column, the degree of overlap between exposed spots in the X direction (perpendicular to the substrate scanning direction Y) can be closely controlled by varying the angle of rotation of the optical column concerned about an axis parallel to the optical axis of the projection system 108. However, where a feature in the requested dose-map extends along the X direction from a region that is imaged from a first row of the spot grid to a region that is imaged from a second row of the spot grid, it might no longer be possible mechanically to control the overlap between the patterns produced by each of the rows to the extent necessary to produce a uniform dose-map in the region of the connection point. Therefore, methods are required to "seam" together the patterns from each of the rows of the spot grid so as to produce a uniform dose-map. This type of seaming is termed "intra-column seaming," as the seaming is concerned with connecting together patterns produced by different portions of the same optical column.

"Inter-column seaming" is necessary where a pattern extends from a region imaged by a first optical column to a region imaged by a second optical column. In the above-described types of seaming, overlap can occur between exposed spots to a significantly greater extent than normal. A third related situation arises when the substrate scanning speed is deliberately slowed down in order to achieve an increased exposure dose. Here, the exposed spot overlap in the scanning direction is increased (e.g., the laser frequency is held constant).

The above instances of increased exposed spot overlap can cause problems when calculating the exposed spot intensities necessary to achieve a given requested dose-map. In particular, according to the present embodiment where a pseudo-inverse matrix of the point-spread functions is used, exposed spots that are very close to each other lead to a more singular matrix [K], which leads to numerical instability when calculating the pseudo-inverse. This can negatively affect the efficiency and reliability of the data manipulation device 50.

In the case of intra-column seaming, the instability problem can clearly be seen where two exposed spots with the same point-spread function overlap completely. This situation results in two rows of the matrix [K] being identical, which means the matrix is singular and non-invertible (the smallest singular-value is zero—singular values are defined by reference to the Singular Value Decomposition (SVD) method discussed below; see also "Digital Image Processing" by Kenneth R. Castleman, page 642, which is incorporated herein by reference in its entirety). Exposed spots that are extremely close together but not overlapping exactly will lead to extremely small singular-values and a highly singular matrix. One of the practical effects of this numerical instability is that hardware needs to be provided with a high dynamic range in order to perform calculations accurately with numbers that vary greatly in magnitude. The calculations can be carried out much more effectively if the numbers concerned are closer to each other in size. The extent to which this is the case for a given matrix can be measured by what is known as a "condition number" associated with the matrix, which gives information about how singular the matrix is. The condition number is defined as the ratio of the largest singular value $\lambda_{max}$ to the smallest singular value $\lambda_{min}$.

For intra-column seaming, as discussed above, one is normally concerned with seaming the overlap between two rows of exposed spots within one optical column. The overlap region between spot grid rows can be as small as four exposed spots in the worst case. The amount of overlap is determined by the angular position of the micro-lens array, the angular position of the object table 106 and the individual spot position errors. Tapering could in principle be used (where the dose from each overlapping row is made gradually to decrease over the overlap region), but in practice this would be extremely difficult where the overlap region comprises such a small number of exposed spots, as the tapering profile would be extremely steep with respect to the point-spread function. It would be difficult to avoid introducing large errors in such a scenario (or at least significantly increasing the costs of manufacture if these errors were to be reduced). This is the principal reason why tapering is considered to be an inferior solution to that provided by the present embodiment.

Three approaches can be used for dealing with the excessive exposed spot overlap problem.

Firstly, extra balancing equations can be added to the matrix [K] before it is inverted as extra rows, the rows containing the balancing equations being removed from the resulting inverse matrix. The inclusion of extra rows allows two exposed spots to be effectively tied together with a weighting being applied to each.

Secondly, smaller kernels (i.e., individual pseudo-inverse matrices), one associated with each optical column, are seamed together in their overlapping regions for inter-column seaming by tapering the dose contribution from each of the optical columns concerned in the overlap region.

Thirdly, as is described in more detail below, the Singular Value Decomposition (SVD) method can be used to decompose the matrix [K] into orthogonal eigen-vectors and singular values before inversion. Once exposed/identified in this way, the small singular values (which are the cause of the numerical problems) can be removed allowing the inversion process to be carried out efficiently. The small singular values that are removed can be, for example, those with a magnitude less than a threshold magnitude (e.g., those with a magnitude less than 10% of the amplitude of a maximum singular value). The result is that overlap regions are dealt with more efficiently and the speed with which the least squares fit is carried out in real time is also increased. Both effects improve the performance of the lithographic apparatus.

The use of balancing equations effectively treats exposed spots that are close together or coincident as separate exposed spots with reduced weight. For example, two exactly overlapping exposed spots can be split apart into separate exposed spots at slightly different locations with the radiation dose being reduced, for example by 50% (other relative weightings can also be chosen). Unfortunately, some side-effects exist with this approach. Perhaps the most important of these is related to the fact that the new entity represented by the two separated and weighted exposed spots no longer has the same spatial intensity distribution as a single exposed spot (the point-spread function has effectively been changed). This abnormal behavior leads to errors because it is not properly taken into account in the calculations for converting the requested dose-map to a signal to be applied to the array of individually controllable elements, because this calculation relies upon individual exposed spots having more or less the same point-spread function.

Generally speaking, the balancing equations will act to tie together the intensities of neighboring exposed spots and create larger effective exposed spots and/or effective exposed spots that extend in an anisotropic manner. One consequence of this is that the dose of such an exposed spot will need to be taken into account over a larger area of the dose-map than is normally necessary for a normal exposed spot.

The SVD approach does not suffer from the same problems as those discussed above and can be used for intra-column seaming, inter-column seaming (where a large matrix [K] is used to represent two or more optical columns and where one is considering the overlap between optical columns represented by the same matrix), and increased overlap in the Y direction caused by a reduced scanning speed.

The approach of neglecting small singular values has advantages over other methods also in the way it tackles the problem of MURA. MURA, which is a particular problem in flat panel display applications, is a visible defect that occurs due to regions of a display being better defined than other regions. This can occur in seaming situations, or in situations of reduced exposed spot pitch in the scan direction due to slow speed scanning, because a larger density of exposed spots in a given region can allow the requested dose-map to be achieved to a higher precision. For example, in the case of intra-column seaming, such an increased exposed spot concentration would typically be found every 300 microns or so (corresponding to the spot grid repeat distance). The resulting periodic variation in dose-map resolution could be highly visible. The approach of neglecting small singular values has the effect of maintaining a more constant exposed spot density on the substrate and therefore avoiding the phenomena of MURA. A further advantage of this approach is that it can be less sensitive to drifts in the angular position of optical columns than tapering-based methods.

Inter-column seaming presents different problems than intra-column seaming in that the overlap region is much larger. A typical overlap can be as much as 1 mm, which corresponds to about 800 exposed spots. Tapering can therefore be used between the patterns produced by different optical columns without suffering the same accuracy problems that would be encountered if tapering were to be used for intra-column seaming. However, the direct matrix inversion approach using $[K]^+$ is particularly easily adapted to this situation. This is because the matrix [K] does not have to be inverted as a whole (combined for all optical columns), but can be calculated using much smaller kernels, one for each optical column (the combination of which make up the matrix [K]). These smaller kernels can be inverted individually and seamed together (using tapering in the overlap regions) to give the seamed matrix $[K]^+_{tapered}$.

This approach also has the advantage that small movements between two optical columns (along X and Y) can be corrected without having to re-generate the inverse matrices for each optical column. Instead, the correction can be built into the function used to define the tapering. The correction might be applied, for example, in the spatial manipulation algorithm, which deals with the transformation between the pattern coordinate system as designed and the pattern coordinate system as exposed (i.e., the scan movement coordinate system, derived from a parameter set supplied by an object table alignment/control system). According to this arrangement the spatial manipulation algorithm can be arranged to supply each of the smaller kernels with the required requested dose pattern [D], which shall be aligned with the calculation grid used to generate the inverted tapered matrix for the collection of optical columns $[K]^+_{tapered}$.

A further problem associated with seaming concerns the identification of seaming regions in the exposed pattern. As mentioned above, with pixel grid imaging, the exposed pattern on the substrate 114 is built up over time such that neighboring exposed spots are generally exposed at different times. This arrangement can make it difficult to identify the regions of the pattern that will be affected by seaming since it might not be known where the pattern is printed with respect to the optics. This presents a problem when evaluating the effectiveness of seaming strategies and, more generally, when evaluating the quality of the image written to the substrate.

This problem can be addressed by arranging for specific pixels to be switched off near to where seaming will be implemented. The pixels to choose are easily identified since the seaming occurs because of hardware features (both for inter- and intra-column seaming). The deliberate introduction of dead pixels causes parallel thin lines to be formed in the exposed pattern along the scanning direction, and these parallel lines can be used to indicate the location of seaming regions. For example, pixels near the end of a given row in the spot grid (rows being defined as before, along the axis of the spot grid most parallel to the scanning direction Y) can be chosen to indicate intra-column seaming, and pixels near the edge of individual optical columns can be used to indicate the inter-column seaming. This marking of the seaming region can be carried out in the hardware associated with actuating the array(s) of individually controllable elements rather than as part of the data path architecture. Straight parallel lines have been given as an example because these are particularly easily implemented but the hardware could be programmed to provide other marker features (such as broken lines) to indicate where seaming has taken place.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A lithography apparatus, comprising:
   a projection system configured to project a beam of radiation onto a substrate as an array of sub-beams of radiation;
   an array of individually controllable elements configured to modulate said sub-beams of radiation; and
   a data path including at least one data manipulation device arranged to at least partly convert data defining a requested pattern to a control signal suitable for controlling said array of individually controllable elements to form substantially said requested pattern on said substrate,
   wherein said at least one data manipulation device is arranged to carry out the conversion by applying a pseudo-inverted form of a point-spread function matrix to a column vector representing said requested pattern, said point-spread function matrix including information about the shape and relative position of the point-spread function of spots to be exposed on said substrate by one of said sub-beams of radiation at a given time.

2. The lithography apparatus of claim 1, wherein said pseudo-inverted matrix is of a type obtained by singular value decomposition of said point-spread function matrix.

3. The lithographic apparatus of claim 2, wherein singular values of said point-spread function matrix with a magnitude less than a threshold magnitude are excluded prior to inversion.

4. The lithography apparatus of claim 3, wherein said threshold magnitude is equal to about 10% of the amplitude of a maximum singular value.

5. The lithography apparatus of claim 1, wherein said column vector represents said requested pattern as defined at a plurality of grid positions on said substrate.

6. A device manufacturing method, comprising:
   projecting a beam of radiation onto a substrate as an array of sub-beams of radiation;
   modulating the sub-beams of radiation with an array of individually controllable elements; and
   executing at a data manipulation device in a data path at least partial conversion of data defining a requested pattern to a control signal suitable for controlling the array of individually controllable elements to form substantially the requested pattern on the substrate,
   wherein the at least partial conversion of data is carried out by applying a pseudo-inverted form of a point-spread function matrix to a column vector representing the requested pattern, the point-spread function matrix including information about the shape and relative position of the point-spread function of spots to be exposed on the substrate by one of the sub-beams of radiation at a given time.

7. The device manufacturing method of claim 6, wherein the pseudo-inverted matrix is obtained by the following steps:
   decomposing the point-spread function matrix and obtaining the singular values thereof using a Singular Value Decomposition method; and
   obtaining the pseudo-inverse of the point-spread function matrix based on the decomposed point-spread function matrix.

8. The device manufacturing method of claim 7, wherein singular values of the point-spread function matrix with magnitude less than a threshold magnitude are excluded prior to inversion.

9. The device manufacturing method of claim 8, wherein the threshold magnitude is equal to about 10% of the amplitude of a maximum singular value.

10. The device manufacturing method of claim 6, wherein the column vector represents the requested pattern as defined at a plurality of grid positions on the substrate.

* * * * *